(12) United States Patent
Kim

(10) Patent No.: US 8,670,262 B2
(45) Date of Patent: *Mar. 11, 2014

(54) HYBRID SOLID-STATE MEMORY SYSTEM HAVING VOLATILE AND NON-VOLATILE MEMORY

(75) Inventor: Jin-Ki Kim, Kanata (CA)

(73) Assignee: Mosaid Technologies Incorporated, Ottawa (CA)

( * ) Notice: Subject to any disclaimer, the term of this patent is extended or adjusted under 35 U.S.C. 154(b) by 156 days.

This patent is subject to a terminal disclaimer.

(21) Appl. No.: 13/040,254

(22) Filed: Mar. 3, 2011

(65) Prior Publication Data
US 2011/0153973 A1    Jun. 23, 2011

Related U.S. Application Data

(63) Continuation of application No. 12/472,012, filed on May 26, 2009, now Pat. No. 7,924,635, which is a continuation of application No. 11/613,325, filed on Dec. 20, 2006, now Pat. No. 7,554,855.

(51) Int. Cl.
*G11C 5/06* (2006.01)
(52) U.S. Cl.
USPC ............... 365/63; 365/189.03; 365/185.05
(58) Field of Classification Search
USPC ............ 365/63, 189.03, 185.05, 202, 185.02, 365/185.18, 189.05, 185.24, 185.33
See application file for complete search history.

(56) References Cited

U.S. PATENT DOCUMENTS

| | | | |
|---|---|---|---|
| 5,359,569 A | 10/1994 | Fujita et al. | |
| 5,404,460 A | 4/1995 | Thomsen et al. | |
| 5,430,859 A | 7/1995 | Norman et al. | |
| 5,475,854 A | 12/1995 | Thomsen et al. | |
| 5,600,596 A | 2/1997 | Shirakihara | |
| 5,806,070 A | 9/1998 | Norman et al. | |
| 6,009,479 A | 12/1999 | Jeffries | |
| 6,144,576 A | 11/2000 | Leddige et al. | |
| 6,148,363 A | 11/2000 | Lofgren et al. | |
| 6,304,921 B1 | 10/2001 | Rooke | |
| 6,317,812 B1 | 11/2001 | Lofgren et al. | |
| 6,418,506 B1 | 7/2002 | Pashley et al. | |

(Continued)

FOREIGN PATENT DOCUMENTS

| EP | 0566306 | 10/1993 |
|---|---|---|
| EP | 1712985 | 10/2006 |

(Continued)

OTHER PUBLICATIONS

King et al., "Communicating with Daisy Chained MCP42XXX Digital Potentiometers", 2001 Microtechnology Inc.

(Continued)

*Primary Examiner* — Vanthu Nguyen
(74) *Attorney, Agent, or Firm* — Dennis R. Haszko

(57) ABSTRACT

A hybrid solid-state memory system is provided for storing data. The solid-state memory system comprises a volatile solid-state memory, a non-volatile solid-state memory, and a memory controller. Further, a method is provided for storing data in the solid-state memory system. The method comprises the following steps. A write command is received by the memory controller. Write data is stored in the volatile memory in response to the write command. Data is transferred from the volatile memory to the non-volatile memory in response to a data transfer request.

15 Claims, 9 Drawing Sheets

(56) References Cited

U.S. PATENT DOCUMENTS

| | | |
|---|---|---|
| 6,453,365 B1 | 9/2002 | Habot |
| 6,484,250 B1 | 11/2002 | Mei et al. |
| 6,513,094 B1 * | 1/2003 | Magro .................. 711/103 |
| 6,567,904 B1 | 5/2003 | Khandekar et al. |
| 6,658,509 B1 | 12/2003 | Bonella et al. |
| 6,715,044 B2 | 3/2004 | Lofgren et al. |
| 6,763,424 B2 | 7/2004 | Conley |
| 6,765,812 B2 | 7/2004 | Anderson |
| 6,775,184 B1 | 8/2004 | Park et al. |
| 6,928,501 B2 | 8/2005 | Andreas et al. |
| 6,944,697 B2 | 9/2005 | Andreas |
| 6,950,325 B1 | 9/2005 | Chen |
| 6,996,644 B2 | 2/2006 | Schoch et al. |
| 7,031,221 B2 | 4/2006 | Mooney et al. |
| 7,032,039 B2 | 4/2006 | DeCaro et al. |
| 7,050,322 B2 | 5/2006 | Zambrano |
| 7,073,022 B2 | 7/2006 | El-Batal et al. |
| 7,266,664 B2 | 9/2007 | Higuchi et al. |
| 7,269,708 B2 | 9/2007 | Ware |
| 7,516,267 B2 | 4/2009 | Coulson et al. |
| 7,554,855 B2 | 6/2009 | Kim |
| 7,689,761 B2 * | 3/2010 | Yim et al. .................. 711/103 |
| 7,827,348 B2 * | 11/2010 | Lee et al. .................. 711/103 |
| 7,924,635 B2 * | 4/2011 | Kim .................. 365/189.2 |
| 2001/0026487 A1 | 10/2001 | Koga |
| 2002/0120820 A1 | 8/2002 | Higuchi et al. |
| 2003/0221061 A1 | 11/2003 | El-Batal et al. |
| 2004/0141374 A1 | 7/2004 | Park et al. |
| 2004/0148482 A1 | 7/2004 | Grundy et al. |
| 2004/0193782 A1 * | 9/2004 | Bordui .................. 711/103 |
| 2005/0132128 A1 | 6/2005 | Lee |
| 2005/0185493 A1 | 8/2005 | Fujioka et al. |
| 2005/0235131 A1 | 10/2005 | Ware |
| 2007/0076479 A1 | 4/2007 | Kim et al. |
| 2007/0109833 A1 | 5/2007 | Pyeon et al. |
| 2007/0168698 A1 | 7/2007 | Coulson et al. |
| 2007/0177430 A1 | 8/2007 | Morio |
| 2008/0005518 A1 | 1/2008 | Gillingham et al. |
| 2008/0084727 A1 | 4/2008 | Norman |
| 2008/0130386 A1 | 6/2008 | Pyeon |
| 2008/0291727 A1 | 11/2008 | Seo et al. |

FOREIGN PATENT DOCUMENTS

| | | |
|---|---|---|
| EP | 1717985 | 11/2006 |
| JP | 05-216775 | 8/1993 |
| JP | 08129509 | 5/1996 |
| JP | 2001051896 | 2/2001 |
| JP | 2003015928 | 1/2003 |
| JP | 2003256269 | 9/2003 |
| JP | 2004-505332 | 2/2004 |
| JP | 2004348342 | 12/2004 |
| JP | 2005-182983 | 7/2005 |
| JP | 2006178983 | 7/2006 |
| JP | 2006294218 | 10/2006 |

OTHER PUBLICATIONS

Microchip Product Description 24AA1025/24LC1025/24FC1025, 2006 Michropchip Technology Inc.

Intel, "Intel StrataFlash Wireless Memory (L18)", Order No. 251902, Revision 010, Aug. 2005.

Intel, "How to Use OTP Registers for Security Applications", Application Note 717, Oct. 1999, Order No. 292265-001.

Samsung Electronics Product Description "K9XXG08Uxm".

Atmel Product Description "8-megabit 2.5-volt Only or 2.7-volt Only DataFlash", AT45DB081B.

The 12C-Bus Specification, Version 2.1, Jan. 2000.

Spansion Data Sheet, S70GL01GN00 MirrorBit Flash 1024 Megabit, 3.0 Volt-only Page Mode Flash Memory Featuring 110 mm MirrorBit Process Technology, Jun. 1, 2005.

Silicon Storage Technology, Inc. Specification, "16 Mbit SPI Serial Flash".

ST Product Description, "2 Mbit, Low Voltage, Serial Flash Memory With 40 MHz SPI bus Interface", Aug. 2005.

Hyper Transport Technology Consortium, HyperTransport I/O Link Specification, Revision 3.00, Apr. 21, 2006.

Samsung, "DDR2 Fully Buffered DIMM: 240pin FBDIMMs based on 512Mb C-die".

Kennedy et al., "A 2Gb/s Point-to-Point Heterogeneous Voltage Capable DRAM for Capacity-Scalable Memory Subsystems", IEEE International Solid-State Circuits Conference, 2004.

Kim et al., A 3.6Gb/s/pin Simultaneous Bidirectional (SBD) I/O Interface for High-Speed DRAM, IEEE International Solid-State Circuits Conference, 2004.

IEEE Standard for High-Bandwidth Memory Interface Based on Scalable Coherent Interface (SCI) Signaling Technology (RamLink), IEEE Std. 1596.4-1996, The Institute of Electrical Electronics Engineers, Inc., pp. i-91, (Mar. 1996).

PCT International Search Report and Written Opinion issued by the Canadian Intellectual Property Office dated Apr. 10, 2008 for corresponding International Application No. PCT/CA2007/002304 filed Dec. 18, 2007.

Jun. Lee, et al., "A 90-nm CMOS 1.8-V 2-Gb NAND Flash Memory for Mass Storage Applications," Jun. 23, 2003, pp. 1934-1942.

EP07855586, Extended European Search Report, 6 pages, Feb. 10, 2010.

EP Patent Application No. 07 855 586.9 Communication pursuant to Article 94(e) EPC (First Office Action), 4 pages, May 20, 2010.

PCT/CA2007/002304, International Preliminary Report on Patentability, and Written Opinion, 6 pages, Jun. 24, 2009.

* cited by examiner

500

HYBRID SOLID-STATE MEMORY SYSTEM HAVING VOLATILE AND NON-VOLATILE MEMORY

CROSS REFERENCE TO RELATED APPLICATIONS

This application is a continuation of U.S. patent application Ser. No. 12/472,012, filed May 26, 2009 (now issued as U.S. Pat. No. 7,924,635 on Apr. 12, 2011) which is a continuation of U.S. patent application Ser. No. 11/613,325, filed Dec. 20, 2006 (now issued as U.S. Pat. No. 7,554,855 on Jun. 30, 2009), the contents of each being expressly incorporated herein by reference.

FIELD OF THE INVENTION

The present invention relates generally to a solid-state memory system, and specifically to a hybrid solid-state memory system that comprises both volatile and non-volatile memory.

BACKGROUND

The most common mass storage system in computer systems today is a hard disk drive (HDD) that uses one or more rotating disks and records data magnetically. Although HDDs are capable of storing a large amount of information, they have disadvantages compared to solid-state memories. Specifically, HDDs have a slower read/write speed, higher power consumption, larger system size, and lower tolerance to mechanical shock.

Solid-state memories are data storage devices that use memory chips to store data. Non-volatile solid-state memories, such as flash memory for example, are becoming increasingly popular as their memory density increases. It is envisioned that eventually solid-state memories will replace HDDs in mobile computers, such as notebook computers, because of their advantages, as discussed above.

However, there are known problems associated with the use of flash memory. One known problem is flash memory cells have a limited number of rewrite cycles. For example, typical maximum number of rewrite cycles range between 100,000 and 1,000,000 cycles. Further, in order to meet memory density and low cost requirements, multilevel cell (MLC) technology will likely be employed. However, MLC typically reduces the maximum number of rewrite cycles per flash memory cell by two orders of magnitude, for example from 1,000,000 cycles to 10,000 cycles.

Another issue with flash memory is a size mismatch between read/program and erase operations. Specifically, in flash memory, read and program operations are executed on a page basis, while erase operations are executed on a block basis. Therefore the minimum erasable size is typically 16 to 64 times larger than the read/program size. Since memory cells in flash memory devices must be erased before being programmed with new data, an entire block has to be erased in order to write a new page. This further exacerbates the problem of having a limited number of rewrite cycles.

Accordingly, a number of solutions have been proposed to address these issues. Many of these attempted solutions are described in U.S. Pat. No. 6,763,424 issued to Conley. However, while these solutions provide certain improvements, they still require a significant number of pages to be rewritten.

Accordingly it can be seen that there is a need for a memory system that further reduces the number of read/write operations performed by the flash memory, thereby extending a life expectancy of the memory system.

SUMMARY

It is an object of the present invention to obviate or mitigate at least some of the above-mentioned disadvantages. Accordingly, a solid-state memory storage system is provided that combines both volatile memories, such as Dynamic Random Access Memory (DRAM) and Static Random Access Memory (SRAM), and non-volatile memories, such as flash memory. The memories are combined in a manner that takes advantage of the benefits of each type of memory to improve the overall system performance and improve the life expectancy of the storage device.

In accordance with an aspect of the present invention, there is provided a solid-state memory system comprising: a volatile solid state memory; a non-volatile solid-state memory; a memory controller configured to store write data in the volatile memory, the memory controller being further configured to transfer data from the volatile memory to the non-volatile memory in response to a data transfer request.

In accordance with a further aspect of the present invention, there is provided a method for storing data in a solid-state memory system comprising a volatile solid-state memory, a non-volatile solid-state memory, and a memory controller, the method comprising the steps of: receiving a command to store write data; storing the write data in the volatile memory in response; and transferring data from the volatile memory to the non-volatile memory in response to a data transfer request.

BRIEF DESCRIPTION OF THE DRAWINGS

Embodiments of the present invention will now be described with reference to the following drawings in which.

DETAILED DESCRIPTION OF THE PREFERRED EMBODIMENTS

Figure 1:
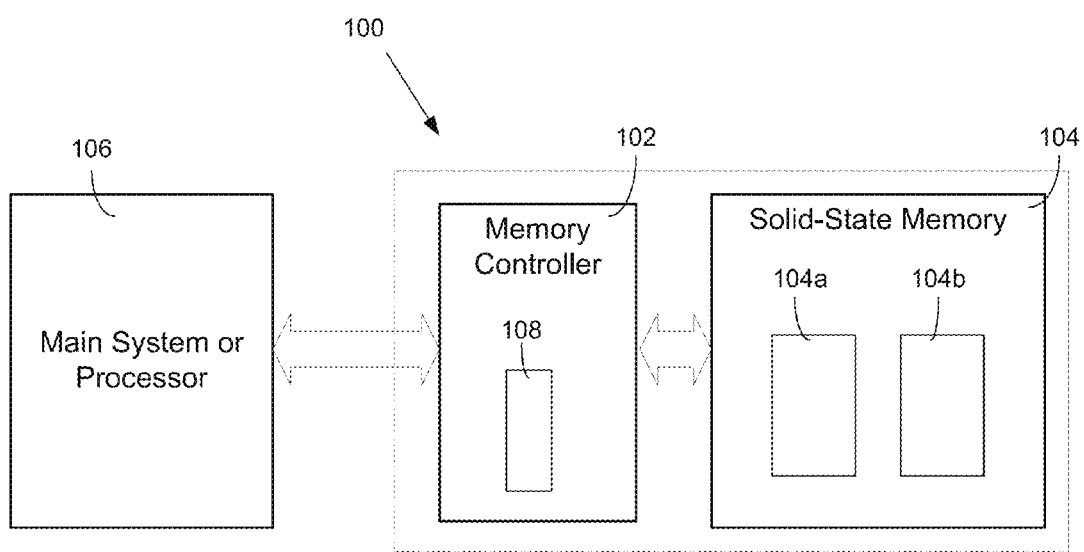
FIG. 1 is a block diagram illustrating a solid-state memory system.

For convenience, like numerals in the specification refer to like structures in the drawings. Referring to FIG. 1 a block diagram of solid-state memory system is illustrated generally by numeral 100. The solid-state memory system 100 comprises a memory controller 102 and a solid-state memory 104. External devices 106 communicate with the solid-state memory 104 via the memory controller 102.

In the present embodiment, the memory controller 102 includes a virtual mapping system 108 (or simply mapping system 108). The mapping system 108 is used to map a logical address associated with the request to a physical address associated with the solid-state memory 104.

The solid-state memory 104 includes volatile memory 104a and non-volatile memory 104b. As will be appreciated, both the volatile memory 104a and the non-volatile memory 104b can include one or more memory devices.

In the present embodiment, the volatile memory 104a comprises DRAM memory and the non-volatile memory 104b comprises NAND flash memory. However it will be appreciated that other types of both volatile and non-volatile memory 104a and 104b may be used.

Since the solid-state memory system 100 includes volatile memory, it may also incorporate an internal battery (not shown) to retain data. If power to the solid-state memory system 100 is lost, the battery would maintain sufficient power to copy data from the volatile memory 104a to the non-volatile memory 104b. More commonly, however, battery power will be provided as part of an external system.

Figure 2:
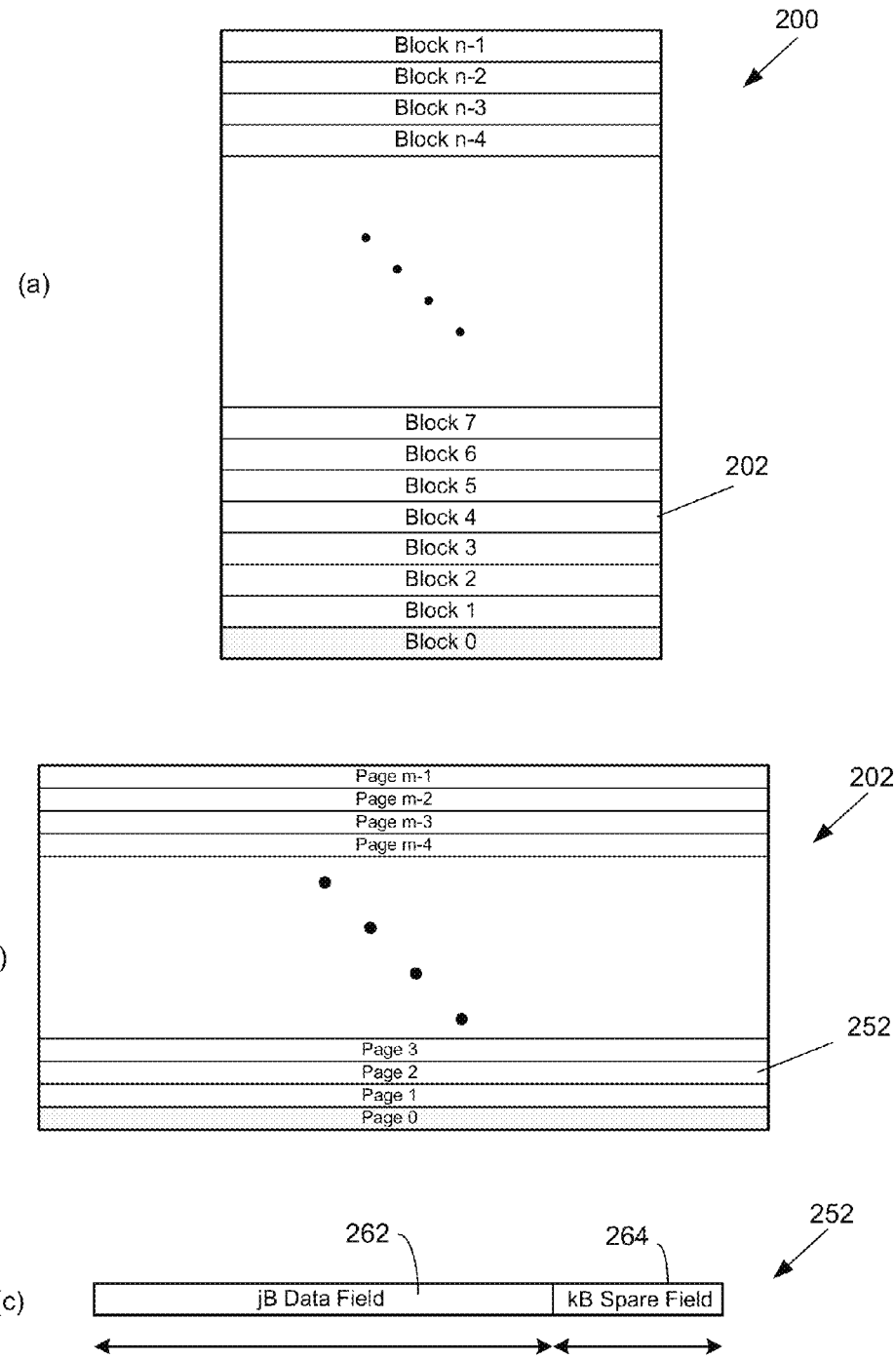
FIG. 2a is a block diagram illustrating a memory cell array structure having a plurality of blocks.
FIG. 2b is a block diagram illustrating a block structure having a plurality of pages.
FIG. 2c is a block diagram illustrating a page structure.

Referring to FIG. 2a, a block diagram illustrating a memory cell array structure is shown generally by numeral 200. The cell array 200 comprises n erasable blocks 202, labelled from Block 0 to Block n−1.

Referring to FIG. 2b, a block diagram illustrating a cell array block 202 in more detail is shown. Each block 202 comprises m programmable pages 252, labelled from Page 0 to Page m−1.

Referring to FIG. 2c, a block diagram illustrating a programmable page 252 in more detail is shown. Each page 252 comprises a data field 262 for storing data and a spare field 264 for storing additional information related to the data, such as error management functions. The data field comprises j bytes (B) and the spare field 264 comprises k bytes (B).

Accordingly, it can be seen that each page 252 comprises (j+k) bytes (B). Each block 202 comprises m pages 252 and, thus, one block 202 is (j+k)*m bytes (B). Further, a total memory size for the cell array 200 of n blocks 202 is (j+k)*m*n bytes (B). For convenience, the following abbreviations are used: 1B=8 bits; 1K=1024; 1M=1024K; and 1G=1024M.

Figure 3:
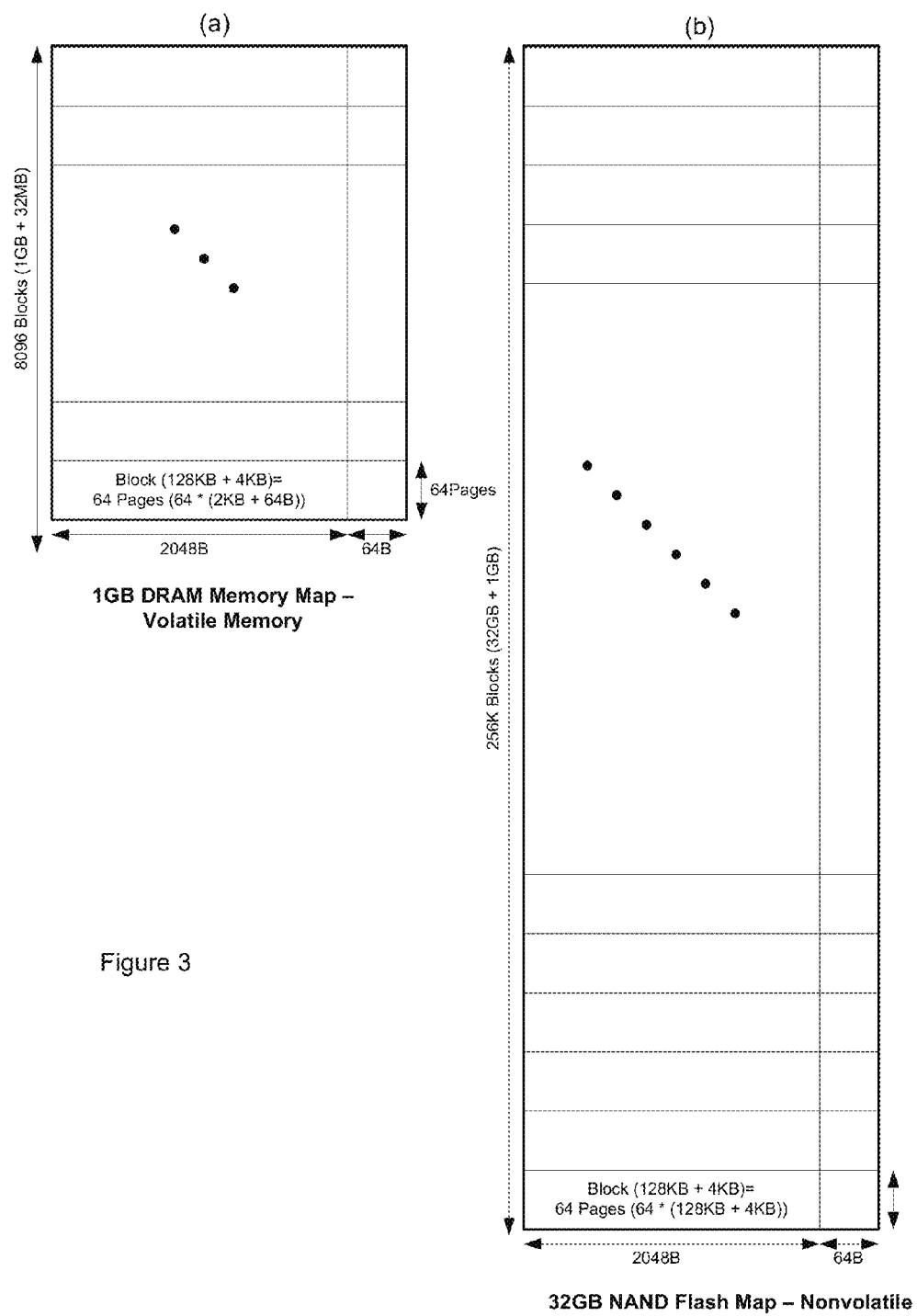
FIGS. 3a and 3b are memory space maps of a volatile and non-volatile memory, respectively.

Referring to FIGS. 3a and 3b, block diagrams illustrating volatile 104a and non-volatile 104b memory, respectively, in accordance with the present embodiment are shown. The following description provides exemplary sizes for pages, blocks and cells. However, it will be appreciated that these size can vary greatly for different implementations and will continue to change as technology advances. Further, it will be appreciated that volatile memory 104a, such as DRAM for example, does not necessarily have a block and page structure. Accordingly, any data temporarily stored in the volatile memory 104a may also include a corresponding block address and/or a page address. The block address and/or page address is referred to when the data is transferred into the non-volatile memory 104b. Therefore as long as the data in the volatile memory 104a is block and page addressable, the volatile memory 104a itself need not be physically mapped onto the non-volatile memory 104b.

In the present embodiment, the size of the page 252 is the same for both the volatile 104a and non-volatile 104b memory. Specifically, the page 252 comprises 2112B; 2048B for the data field 262; and 64B for spare field 264.

Further, the size of the block 202 is the same for both the volatile 104a and non-volatile 104b memory. Specifically, since each block 202 includes 64 pages 252, each block 202 comprises 132 KB; 128 KB for the data field 262; and 4 KB for spare field 264.

In accordance with the present embodiment, the number of blocks 202 in the volatile memory 104a is fewer than the number of blocks 202 in the non-volatile memory 104b. Specifically, the volatile memory 104a comprises 8K blocks and the non-volatile memory 104b comprises 256K blocks. Therefore, the volatile memory 104a comprises 1,056 MB; 1 GB for the data field 262; and 32 MB for the spare field 264. The non-volatile memory 104b comprises 33 GB; 32 GB for the data field 262; and 1 GB for spare field 264.

For clarity, general operation of NAND flash devices is described as follows. Read and program operations are executed on a page basis while erase operations are executed on a block basis.

For a read operation, a READ command followed by a logical address is sent to the solid-state memory system 100. The mapping system determines a physical address corresponding with the logical address. Data corresponding to the physical address is read from the volatile memory 104a, or non-volatile memory 104b if the physical address does not exist in the volatile memory 104a.

In the case where data is read from the non-volatile memory 104b, the read data may be programmed in the volatile memory 104a. Details thereon are described with reference to FIGS. 4 and 5.

For a program operation, a PROGRAM command followed by an address and input data is issued to the solid-state memory system 100. The data is initially programmed in the volatile memory 104a. If the address referenced by the PROGRAM command is already programmed in the volatile memory 104a, the data is overwritten at that address. If the address referenced by the PROGRAM command is not yet programmed in the volatile memory 104a, space for the address is established in the volatile memory 104a.

Figure 4:
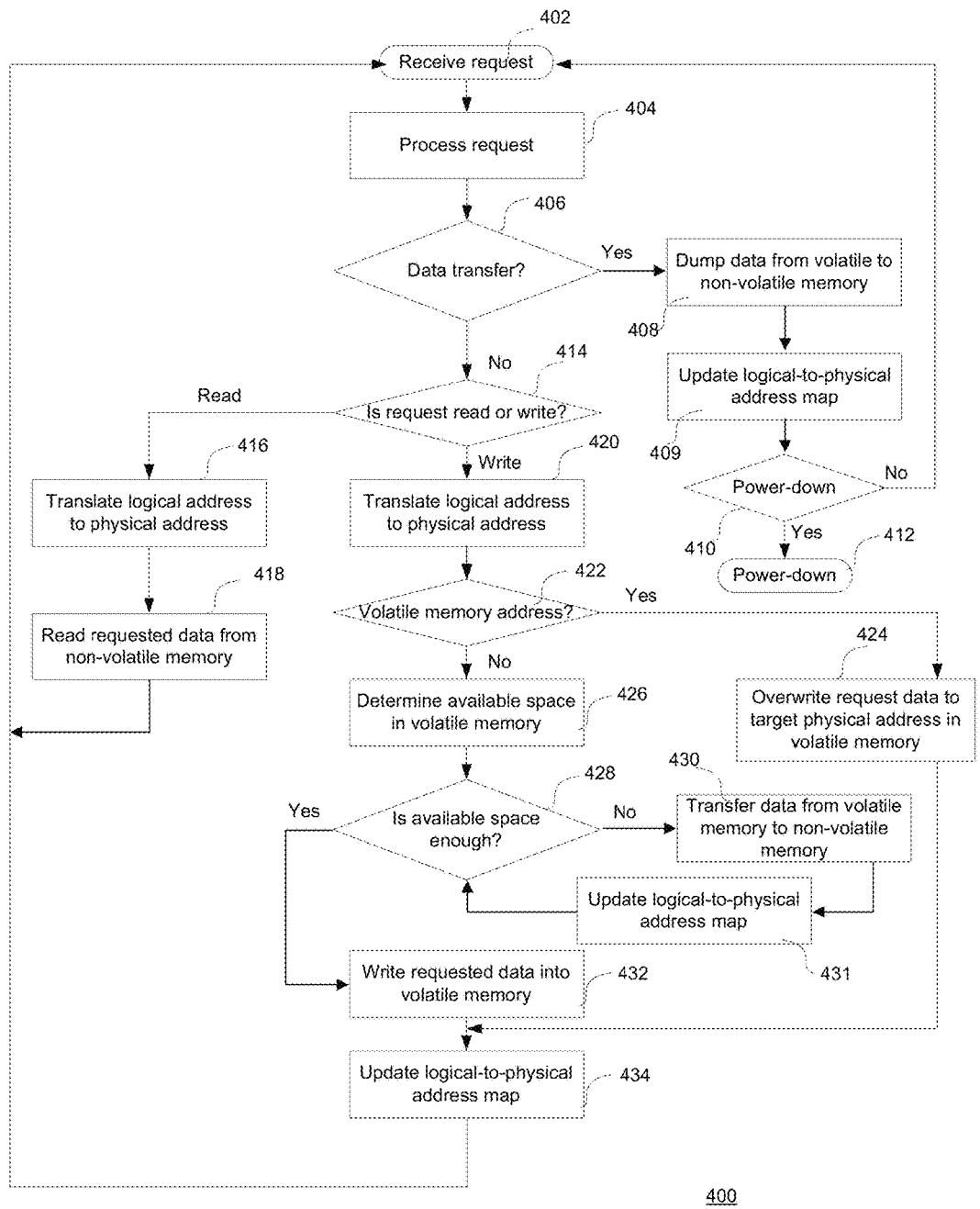
FIGS. 4 and 5 are flow diagrams illustrating a process implemented by the solid-state memory system.

For a block erase operation, a BLOCK ERASE command followed by block addresses is issued to the solid-state memory system 100. The 128K bytes of data in a block are erased in less than a predefined block erase time $t_{BERS}$. Referring to FIG. 4, a flow diagram illustrating a process implemented by the solid-state memory system 100 in accordance with one embodiment is shown generally by numeral 400. In step 402, the memory controller 102 receives an operation request. The operation request typically includes a command. Types of commands include, for example, read, program and erase. Depending on the command, other information may be included as part of the operation request. For example, both a read and a write command will include a logical address. Further, a write command will also include data to be written.

At step 404, the memory controller 102 processes the request and the requested operation is determined. In step 406 it is determined whether or not the request includes an operation that involves a transfer of data from the volatile memory 104a to the non-volatile memory 104b. A number of situations exist for which the data would have to be transferred. For example, system restart, system power down or memory maintenance operations may create a data transfer request. Therefore, if a request to transfer data is received at the memory controller 102, the process continues at step 408. Otherwise, the process continues at step 414.

At step 408, the data stored in the volatile memory 104a is transferred to the non-volatile memory 104b and the mapping system 108 is updated accordingly. The transfer can be done in accordance with any state-of-the-art method for updating data in a non-volatile memory 104b. At step 409, the mapping system 108 is updated with the physical address of the transferred data, which is in the non-volatile memory 104b. At step 410 it is determined whether or not the transfer of data was in response to a power down operation. If the data transfer was performed in response to a power down operation, then at step 412 the solid-state memory system 100 powers down. If the data transfer was performed in response to another operation, the process returns to step 402.

At step 414, it is determined whether the requested operation is a read operation or a write operation. If it is determined that the operation is a read operation the process continues at step 416. Otherwise, the process continues at step 420.

At step 416, the memory controller 102 translates the received logical address of the data to be read into a physical address using the mapping system 108. At step 418, the data is read from the non-volatile memory 104b as is standard in the art and the process returns to step 402.

At step 420 the memory controller 102 translates the received logical address of the data to be written into a physical address using the mapping system 108. In step 422, mapping system 108 determines whether the physical address matches a non-volatile memory address or a volatile memory address.

If the physical address corresponds to a volatile memory address, the process continues at step 424. At step 424, the data accompanying the write operation is written to the physical address in the volatile memory, overwriting the pre-existing data. Writing data to a volatile memory 104a, such as DRAM, does not require that the memory be erased prior to the write operation. Further, volatile memory 104a does not suffer from the rewrite cycle limitation associated with non-volatile memory 104b, such as flash memory. Once the data is written to the volatile memory 104a, the process continues to step 434. At step 434, the mapping system 108 is updated with the physical address of the write data and the process returns to step 402 in order to execute a next operation, if one is pending.

If the physical address corresponds to a non-volatile memory address, the process continues at step 426. At step 426, the memory controller determines the amount of space available in the volatile memory 104a. At step 428, it is determined whether or not the amount of available space is greater than an amount of space required for the data to be written. If there is insufficient space, the process continues at step 430. Otherwise, the process continues at step 432.

At step 430, at least a portion of data stored in the volatile memory 104a is transferred to the non-volatile memory 104b. In the present embodiment, a predefined number of blocks are transferred from the volatile memory 104a to the non-volatile memory 104b. Further, in the present embodiment, the blocks selected for transfer are the most "stale". That is, the blocks that are transferred have had not been accessed for the longest period of time. As described with reference to step 408, the pages can be written to the non-volatile memory 104b in accordance with one of a number of state-of-the-art methods. At step 431, the mapping system 108 is updated to reflect the change in physical address for the transferred data and the process returns to step 428.

At step 432, the data is written to the volatile memory 104a. The method used to write the data to the volatile memory 104a can be any state-of-the-art method, as will be appreciated by a person of ordinary skill in the art. At step 434, the mapping system 108 is updated with the physical address of the write data and the process returns to step 402 in order to execute a next operation, if one is pending.

Accordingly, it can be seen that the present embodiment uses a combination of both volatile and non-volatile memories to improve overall performance of a solid-state memory system. Specifically, relatively inexpensive non-volatile memory is used to provide persistent storage of data. Volatile memory is used to improve limitations related with the use of non-volatile memory. For example, the use of volatile memory as described above improves overall time-performance of the solid-state memory system. Further, since fewer write operations are performed to the non-volatile memory, the effective life expectancy of the non-volatile memory is improved.

Further, in the present embodiment, a read operation is implemented by simply reading the data from the non-volatile memory 104b and outputting it to a requesting device or processor. However, it will be appreciated that in some instances it may be preferable to load the read data into the volatile memory 104a as well.

Figure 5:
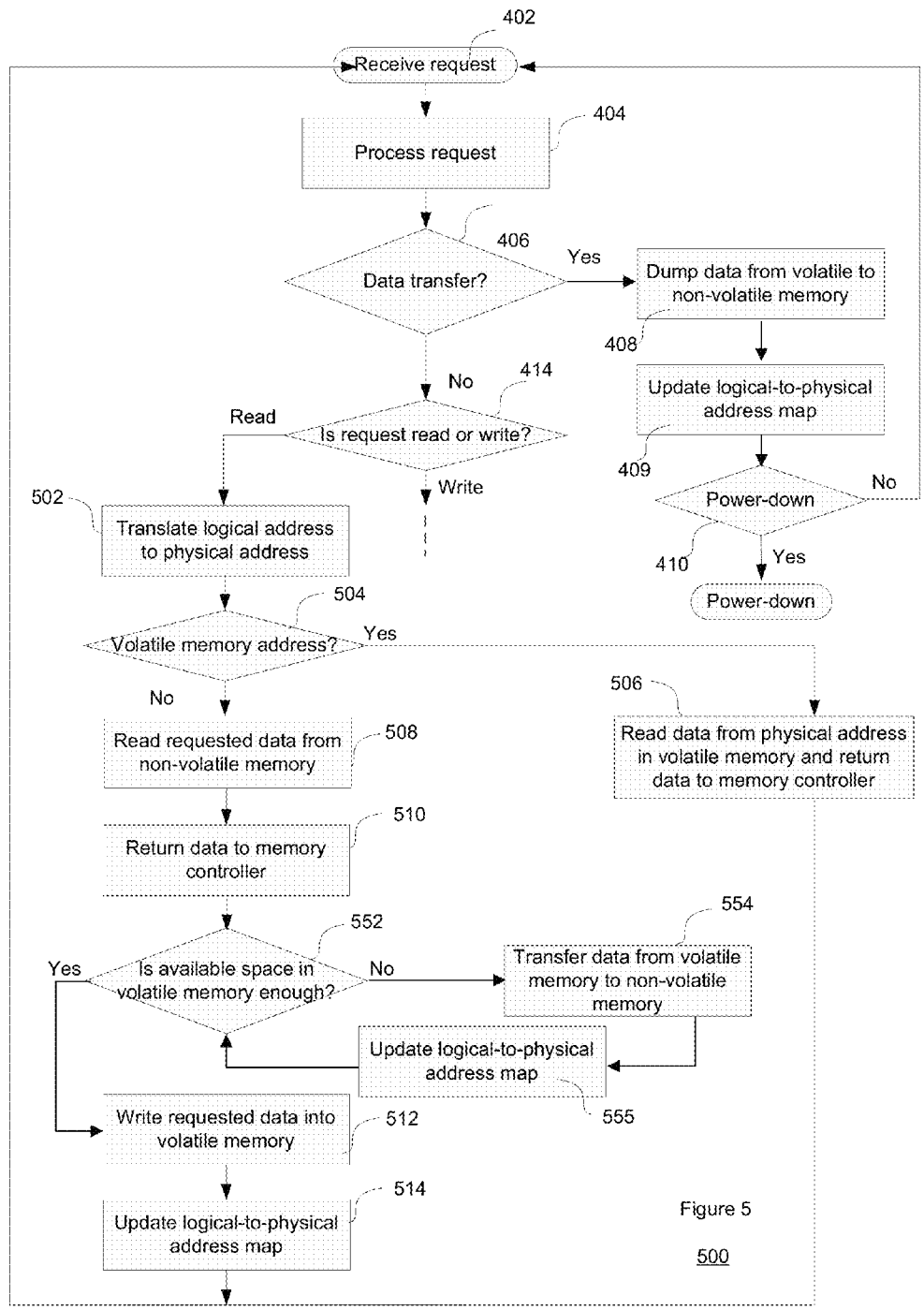

Accordingly, referring to FIG. 5, a flow diagram illustrating a process implemented by the solid-state memory system 100 in accordance with an alternate embodiment is shown generally by numeral 500. In the present embodiment, data transfer and write operations are handled in the same way as described with reference to FIG. 4. Accordingly, FIG. 5 illustrates an alternate process for a read operation and the description begins at step 414.

At step 414, it is determined that the operation request is for a read operation and the process continues at step 502. At step 502 the memory controller 102 translates the received logical address of the data to be read into a physical address using the mapping system 108. In step 504, the mapping system 108 determines whether the physical address matches a non-volatile memory address or a volatile memory address.

If the physical address corresponds to a volatile memory address, the process continues at step 506. At step 506, the data reads the physical address in the volatile memory associated with the read operation. It will be appreciated that the data can be read using state-of-the art methods. Once the data is read from the volatile memory 104a, the process returns to step 402.

If the physical address corresponds to a non-volatile memory address, the process continues at step 508. At step 508, the requested data is read from the physical address in the non-volatile memory 104b associated with the read operation. As described at step 506, the data can be read using state-of-the art methods. At step 510, the data read from the non-volatile memory 104b is made available to the requesting device 106.

At step 552, the memory controller 102 determines the amount of space available in the volatile memory 104a and whether or not the amount of available space is greater than an amount of space required for the data to be written to the volatile memory 104a. If there is insufficient space, the process continues at step 554. Otherwise, the process continues at step 512.

At step 554, at least a portion of data stored in the volatile memory 104a is transferred to the non-volatile memory 104b. In the present embodiment, a predefined number of blocks are transferred from the volatile memory 104a to the non-volatile memory 104b. Further, in the present embodiment, the blocks selected for transfer are the most "stale". As described with reference to steps 408 and 430, the pages can be written to the non-volatile memory 104b in accordance with one of a number of state-of-the-art methods. In step 555, the mapping system 108 is updated to reflect the change in physical address for the transferred data and the process returns to step 552. At step 512, the data read from the non-volatile memory 104b is written to the volatile memory 104a. At step 514, the mapping system 108 is updated with the new physical address for the read data and the process returns to step 402 in order to execute a next operation, if one is pending.

Accordingly, it can be seen that in the embodiments described with reference to FIGS. 4 and 5, data is loaded into the volatile memory 104a for read operations as well as write operation. This may improve the solid-state memory system performance if the same data is accessed before it is transferred back to the non-volatile memory due to the improved access speed of volatile memory.

In the previous embodiment, data may be written to the volatile memory 104a in response to a read or a write operation. In a further embodiment, a tag is provided for each page of data written to the volatile memory 104a to identify the data as being the result of either a read operation or a write operation. The tag may be maintained in either the spare field 264 of the page 252 or in the mapping system 108.

The tag can then be used for other steps in the process. For example, when data is transferred from the volatile memory 104a to the non-volatile memory 104b, only pages with a write tag are transferred. Pages with a read tag may be able to be deleted from the volatile memory 104a since the data is still stored at an associated non-volatile memory address. Accordingly, the mapping system 108 would need to be updated.

Further, the previous embodiment describes freeing space from the volatile memory 104a in accordance with the most stale data. However, the process of determining which blocks to erase may also contemplate whether or not a page includes a read or write tag. For example, in some cases it may be preferable to delete newer pages comprising read tags than an older page comprising write tags. It will be appreciated that different algorithms can be implemented on a using one or more of these or other considerations.

Figure 6:
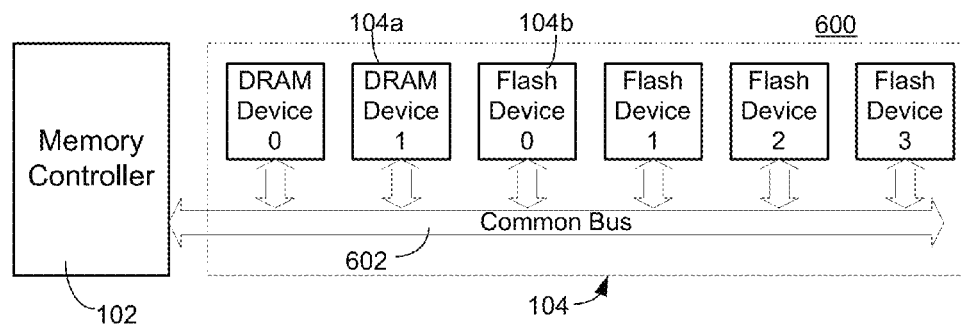
FIG. 6 is a block diagram of a solid-state memory system using a common bus to communicate with a plurality of memory devices.

Referring to FIG. 6, a block diagram of a solid-state memory system in accordance with an alternate embodiment is illustrated by numeral 600. The solid-state memory system 600 comprises a memory controller 102 and a solid-state memory 104. In the present embodiment, the solid-state memory 104 comprises a plurality of volatile memory devices 104a and a plurality of non-volatile memory devices 104b. The volatile memory devices 104a and the non-volatile memory devices 104b are coupled with the memory controller 102 via a common bus 602.

For exemplary purposes only, the volatile memory devices 104a are DRAM devices and the non-volatile memory devices 104b are flash memory devices. Further, although the diagram illustrates two DRAM devices and four flash memory devices, the number of devices may vary depending on the implementation.

In order to access one of the solid-state memory devices 104a or 104b, the common bus 602 includes a device enable signal for enabling only one of the plurality of volatile memory devices 104a or one of a plurality of the non-volatile memory devices 104b at a time. Methods of using an enable signal for activating one of a plurality of memory devices on a common bus are well known in the art and need not be described in detail.

Figure 7:
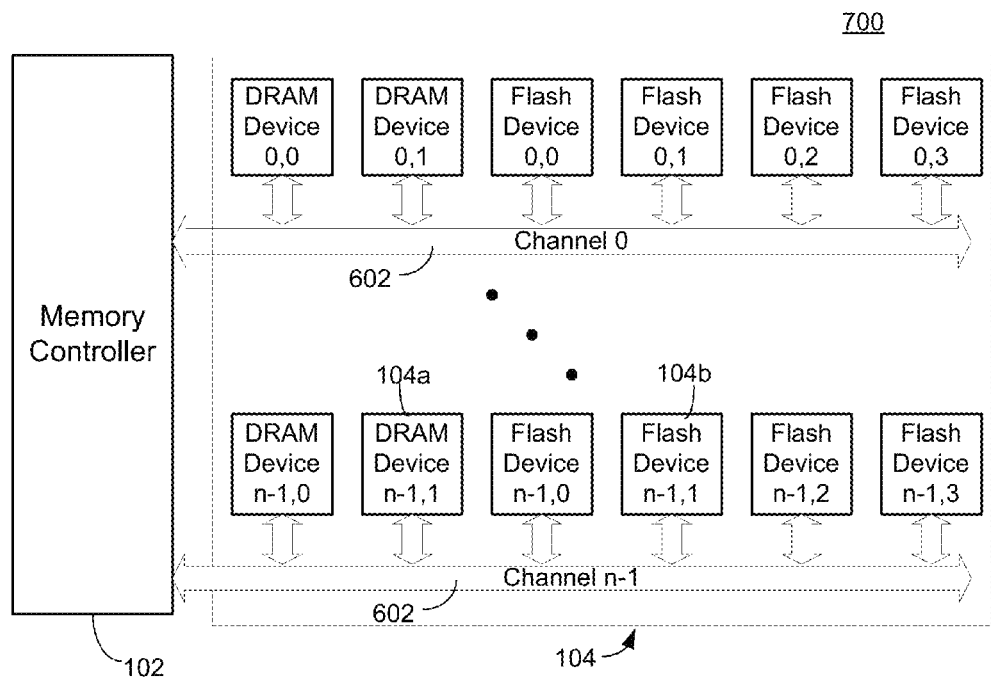
FIG. 7 is a block diagram of a solid-state memory system using a plurality of common buses to communicate with a plurality of memory devices.

Referring to FIG. 7, a block diagram of a solid-state memory system in accordance with another alternate embodiment is illustrated by numeral 700. The solid-state memory system 700 comprises a memory controller 102 and a solid-state memory 104. In the present embodiment, the solid-state memory 104 comprises a plurality of volatile memory devices 104a and a plurality of non-volatile memory devices 104b. The volatile memory devices 104a and the non-volatile memory devices 104b are coupled with the memory controller 102 via a common bus 602. However, unlike the previous embodiment, the memory controller 102 controls a plurality of buses, referred as channels.

In order to access one of the solid-state memory devices 104a or 104b, each channel 602 includes a device enable signal for enabling only one of the memory devices at a time. If the requested operation is a read operation, the enabled memory device outputs the data onto the channel 602. If the requested operation is a write operation, the enabled memory device writes the data from the channel 602.

Each channel 602 works independently. Further, multiple channels 602 can be active at the same time. Using this scheme, the system performance increases along with the number of channels 602 implemented, since the channels 602 operate in parallel.

Figure 8:
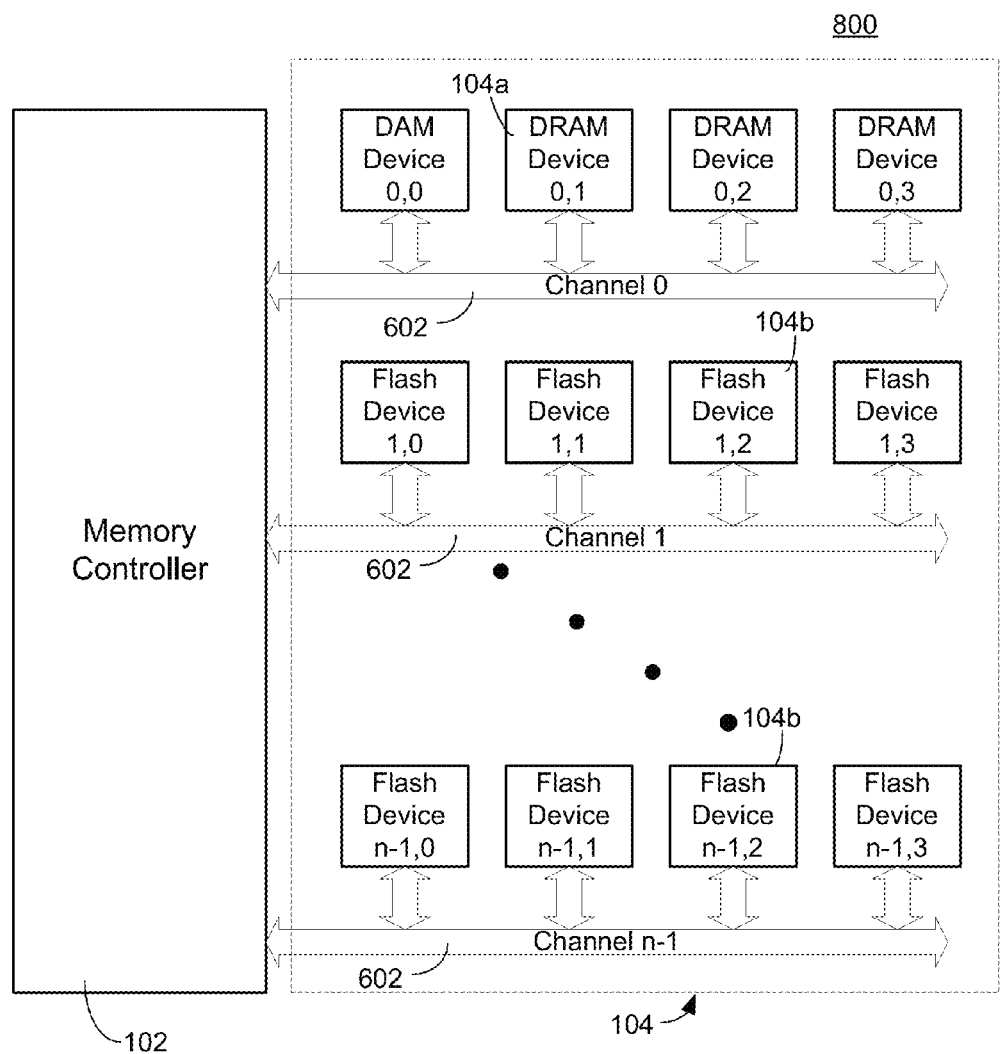
FIG. 8 is a block diagram of a solid-state memory system using a plurality of common buses to communicate with a plurality of memory devices, each bus communicating with one type of memory device.

Referring to FIG. 8, a block diagram of a solid-state memory system in accordance with an alternate embodiment is illustrated by numeral 800. The present embodiment is similar to the previous embodiment and comprises a plurality of channels 602. However, in the present embodiment, each channel is assigned a specific type of solid-state memory device. That is, for an n-channel solid-state memory system 800, m channels are coupled exclusively to volatile memory devices 104a and n-m channels are coupled exclusively to non-volatile memory devices 104b.

Figure 9:
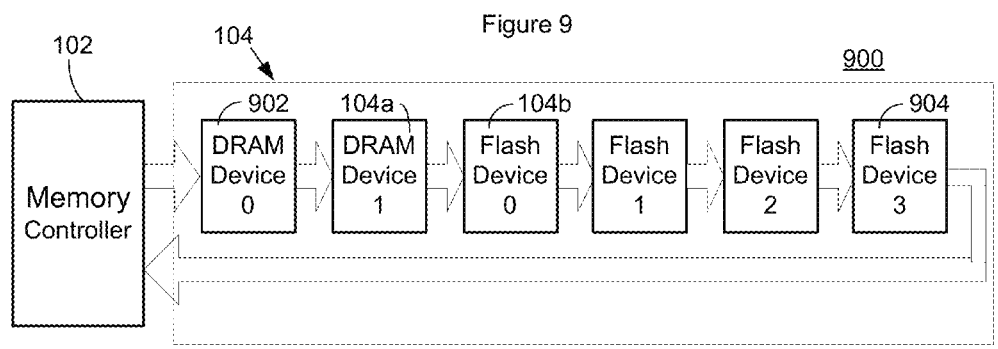
FIG. 9 is a block diagram of a solid-state memory system using a daisy chain structure to communicate with a plurality of memory devices.

Referring to FIG. 9, a block diagram of a solid-state memory system in accordance with yet an alternate embodiment is illustrated by numeral 900. The solid-state memory system 900 comprises a memory controller 102 and a solid-state memory 104. In the present embodiment, the solid-state memory 104 comprises a plurality of volatile memory devices 104a and a plurality of non-volatile memory devices 104b. The volatile memory devices 104a and the non-volatile memory devices 104b are coupled with the memory controller 102 in a daisy chain configuration. That is, the memory controller 102 is coupled to a first one 902 of the memory devices 104a or 104b. The remaining memory devices 104a and 104b are serially coupled and a last serially coupled 904 memory device 104a or 104b is coupled back to the memory controller 102.

In order to access one of the solid-state memory devices 104a or 104b, the memory controller 102 outputs a request to the first memory device 902. The request is passed through the memory devices 104a and 104b until it reaches a target device. The target device performs the requested operation and the results, if any, continue to pass through the chain of memory devices until it reaches the last device 904, which returns the result to the memory controller 102. Methods of using a daisy chain for activating one of a plurality of memory devices are well known in the art and need not be described in detail.

Figure 10:
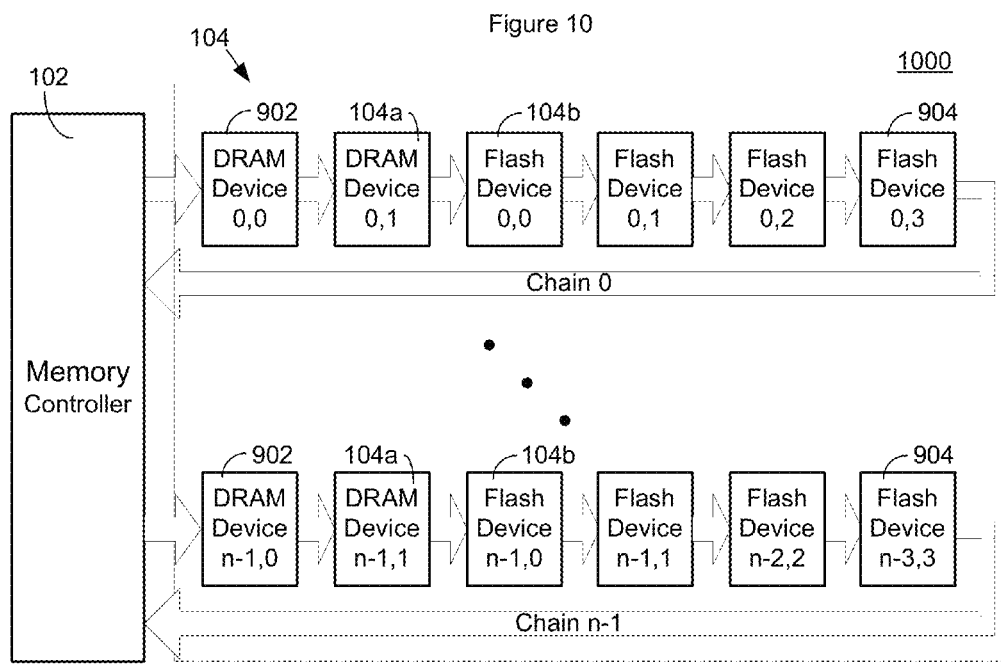
FIG. 10 is a block diagram of a solid-state memory system using a plurality of chains to communicate with a plurality of memory devices.

Referring to FIG. 10, a block diagram of a solid-state memory system in accordance with yet an alternate embodiment is illustrated by numeral 1000. The solid-state memory system 1000 comprises a memory controller 102 and a solid-state memory 104. In the present embodiment, the solid-state memory 104 comprises a plurality of volatile memory devices 104a and a plurality of non-volatile memory devices 104b. The volatile memory devices 104a and the non-volatile memory devices 104b are coupled with the memory controller 102 in a daisy chain configuration. However, unlike the previous embodiment, the memory controller 102 controls a plurality of chains.

Each chain works independently. Further, multiple chains can be active at the same time. Using this scheme, the system performance increases along with the number of chain implemented, since the chains operate in parallel.

Figure 11:
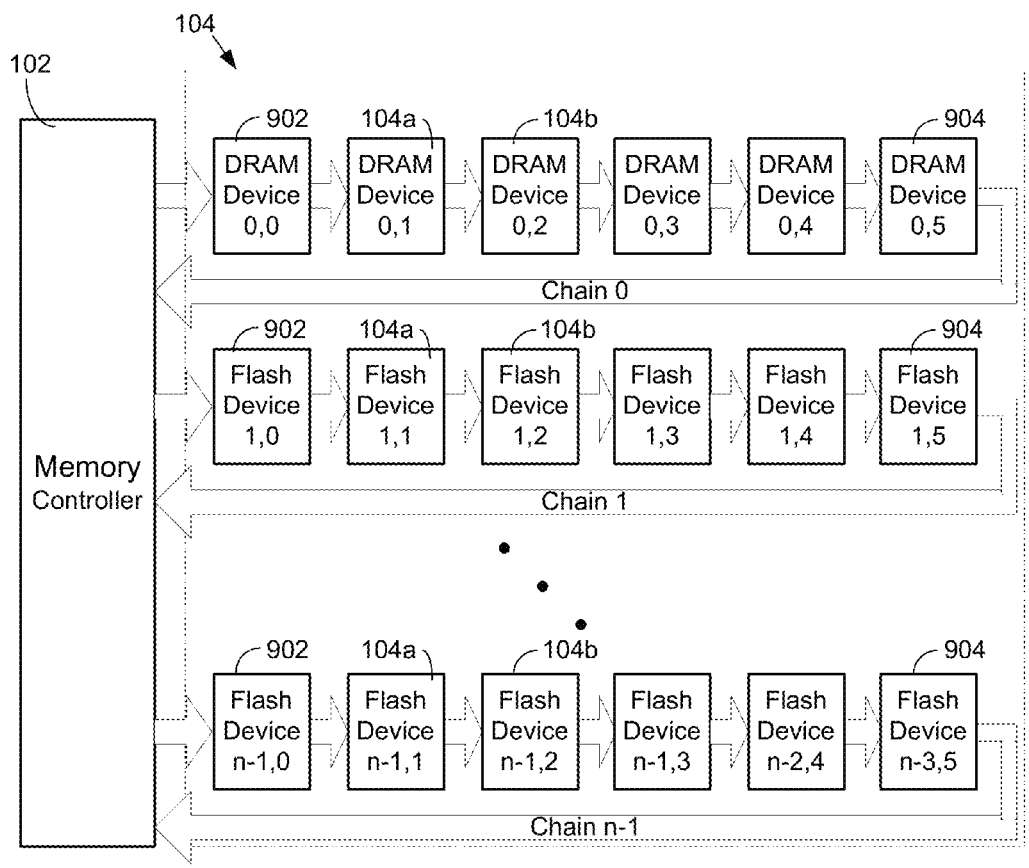
FIG. 11 is a block diagram of a solid-state memory system using a plurality of chains to communicate with a plurality of memory devices, each chain communicating with one type of memory device.

Referring to FIG. 11, a block diagram of a solid-state memory system in accordance with yet an alternate embodiment is illustrated by numeral 1100. The present embodiment is similar to the previous embodiment and comprises a plurality of chains. However, in the present embodiment, each chain is assigned a specific type of solid-state memory device. That is, for an n-chain solid-state memory system 1100, m chains are coupled exclusively to volatile memory devices 104a and n-m chains are coupled exclusively to non-volatile memory devices 104b.

All of the previous embodiments described various ways of implementing an solid-state memory device comprising both volatile and non-volatile memory devices. The devices are combined in such a way as to improve the performance and effective life expectancy of the solid-state memory device.

Although the previous embodiments describe the volatile memory 104a as having fewer blocks 202 than the non-volatile memory 104b, this need not be the case. This arrangement will be the most likely embodiment due to volatile memory 104a limitations with regard to cost, size and persistence. However, there may be situations where the number of blocks for each of the volatile memory 104a and the non-volatile memory 104b are the same. Further, there may be situations where the number of blocks in the volatile memory 104a exceeds the number of blocks in the non-volatile memory 104b.

Lastly, although the invention has been described with reference to certain specific embodiments, various modifications thereof will be apparent to those skilled in the art without departing from the spirit and scope of the invention as defined by the appended claims.

The invention claimed is:

1. A memory system comprising:
a volatile solid-state memory for writing and reading data;
a non-volatile solid-state memory for writing and reading data;
a memory controller for communicating with the volatile memory and non-volatile memory to write and read data in therein, the memory controller being configured:
to receive the data read from the non-volatile memory in response to a data read request;
to provide the received data to the volatile memory to be written thereinto in response to a data write request; and
wherein receiving the data and providing the data are performed by the memory controller in response to a data transfer request that occurs when insufficient space is available in the volatile memory.

2. The solid-state memory system of claim 1, wherein the memory controller is further configured to:
in response to the data read request and before writing the data to the volatile memory, determine whether the amount of space available in the volatile memory is enough for the data to be written to the volatile memory.

3. The solid-state memory system of claim 2, wherein the memory controller is further configured to:
transfer, if there is insufficient space, at least a portion of data stored in the volatile memory to the non-volatile memory.

4. The solid-state memory system of claim 1, wherein the volatile and non-volatile memories are coupled to the memory controller via a common bus.

5. The solid-state memory system of claim 1, wherein the volatile and non-volatile memories are coupled to the memory controller via a plurality of buses, the buses capable of being accessed simultaneously.

6. The solid-state memory system of claim 5, wherein each of the plurality of buses is coupled with either the volatile memory or the non-volatile memory.

7. The solid-state memory system of claim 1, wherein data written to the volatile memory further comprises a tag identifying whether the data is written in response to a read request or a write request.

8. A method for controlling storing data in a solid-state memory system comprising a volatile solid-state memory and a non-volatile solid-state memory, each of the volatile and non-volatile memories being configured to store data and read the stored data, the method comprising:
receiving the data read from the non-volatile memory in response to a data read request;
providing the received data to the volatile memory to be written thereinto in response to a data write request; and
wherein the steps of receiving and providing are performed in response to a data transfer request that occurs when insufficient space is available in the volatile memory.

9. The method of claim 8, further comprising the step of
in response to the data read request and before writing the data to the volatile memory, determining whether the amount of space available in the volatile memory is enough for the data to be written to the volatile memory.

10. The method of claim 9, further comprising the step of
transferring, if there is insufficient space, at least a portion of data stored in the volatile memory to the non-volatile memory.

11. The method of claim 10, wherein the data transfer request is in response to a command requesting transfer of all data from the volatile memory to the non-volatile memory.

12. The method of claim 11, wherein the command requesting transfer of all data comprises a power down command.

13. The method of claim 10, wherein the data transfer request is in response to a lack of available space in the volatile memory.

14. A method for controlling storing data in a solid-state memory system comprising a volatile solid-state memory and a non-volatile solid-state memory, each of the volatile and non-volatile memories being configured to store data and read the stored data, the method comprising:
receiving the data read from the non-volatile memory in response to a data read request;
providing the received data to the volatile memory to be written thereinto in response to a data write request;
in response to the data read request and before writing the data to the volatile memory, determining whether the amount of space available in the volatile memory is enough for the data to be written to the volatile memory;
transferring, if there is insufficient space, at least a portion of data stored in the volatile memory to the non-volatile memory; and
transferring, if there is insufficient space, at least a portion of data stored in the volatile memory to the non-volatile memory;
wherein the steps of receiving and providing are performed in response to a data transfer request, the data transfer request is in response to a lack of available space in the volatile memory, and the data transfer request occurs when the available space in the volatile memory falls below a predefined threshold.

15. A method for controlling storing data in a solid-state memory system comprising a volatile solid-state memory and a non-volatile solid-state memory, each of the volatile and non-volatile memories being configured to store data and read the stored data, the method comprising:
- receiving the data read from the non-volatile memory in response to a data read request;
- providing the received data to the volatile memory to be written thereinto in response to a data write request;
- in response to the data read request and before writing the data to the volatile memory, determining whether the amount of space available in the volatile memory is enough for the data to be written to the volatile memory;
- transferring, if there is insufficient space, at least a portion of data stored in the volatile memory to the non-volatile memory; and
- transferring, if there is insufficient space, at least a portion of data stored in the volatile memory to the non-volatile memory;
- wherein the steps of receiving and providing are performed in response to a data transfer request, the data transfer request is in response to a lack of available space in the volatile memory, and the data transfer request occurs when there is insufficient available space in the volatile memory to perform a requested command.

* * * * *